US005616892A

United States Patent [19]

Ferralli

[11] Patent Number: 5,616,892

[45] Date of Patent: Apr. 1, 1997

[54] VIRTUAL IMAGING MULTIPLE TRANSDUCER SYSTEM

[75] Inventor: Michael W. Ferralli, Fairview, Pa.

[73] Assignee: Technology Licensing Company, Pittsburgh, Pa.

[21] Appl. No.: 587,237

[22] Filed: Jan. 16, 1996

[51] Int. Cl.[6] .......... H05K 5/00

[52] U.S. Cl. .......... 181/155; 181/175

[58] Field of Search .......... 181/155, 175, 181/176, 144, 146, 199, 30; 381/158, 160

[56] References Cited

U.S. PATENT DOCUMENTS

| | | | |
|---|---|---|---|
| 1,716,199 | 6/1929 | Hofe et al. . | |
| 2,064,911 | 12/1936 | Hayes . | |
| 3,007,133 | 10/1961 | Padberg, Jr. . | |
| 3,819,005 | 6/1974 | Westlund . | |
| 3,819,006 | 6/1974 | Westlund . | |
| 3,908,095 | 9/1975 | Jinsenji . | |
| 4,348,750 | 9/1982 | Schwind . | |
| 4,421,200 | 12/1983 | Ferralli et al. | 181/155 X |
| 4,474,258 | 10/1984 | Westlund . | |
| 4,588,042 | 5/1986 | Palet et al. . | |
| 4,629,030 | 12/1986 | Ferralli | 181/155 |
| 4,836,328 | 6/1989 | Ferralli | 181/155 |
| 4,844,198 | 7/1989 | Ferralli | 181/155 |
| 4,907,671 | 3/1990 | Wiley . | |
| 5,258,538 | 12/1983 | Queen . | |
| 5,268,539 | 12/1993 | Ono | 181/155 |
| 5,306,880 | 4/1994 | Coziar et al. . | |
| 5,402,502 | 3/1995 | Boothroyd et al. . | |
| 5,418,336 | 5/1995 | Nigishi et al. . | |

OTHER PUBLICATIONS

Sonic Systems, Inc., Soundsphere Product Technical Information, Model No. 110 A, Fall 1994.

*Primary Examiner*—Khanh Dang
*Attorney, Agent, or Firm*—Titus & McConomy

[57] ABSTRACT

In general, the invention comprises a device capable of emitting either acoustic or electromagnetic radiant energy. The device has at least two transducing elements for producing this energy, and at least one reflector which reflects the energy emitted from the transducing elements. The shape of the reflector surface is defined by both an ellipse and a parabola that are rotated coincidentally about a common axis of revolution (hereinafter referred to as a "para-elliptic" reflector surface), formed by coincidentally rotating, for up to one complete revolution, a section of both geometric shapes about an common axis of revolution that lies in the plane of both geometric shapes. The resulting "para-elliptic" reflector surface will be characterized by two sets of distinct focal points defining two focal curves. Focused energy will be redirected as if emanating from each focal region, causing each focal region to appear as a virtual source of the energy. The radiation pattern, or beamwidth, of this energy will be substantially frequency invariant. However, the beamwidth for either transducer can be adjusted by moving that transducer to another location. In addition, a means is provided for absorbing or attenuating that radiation which is not reflected from the reflector surface, in order to eliminate interference between reflected and non-reflected radiation.

15 Claims, 5 Drawing Sheets

VIRTUAL IMAGING MULTIPLE TRANSDUCER SYSTEM

FIELD OF THE INVENTION

This invention relates to transducers, and specifically to an improved means for combining the output of the transducers used in multiple transducer extended frequency bandwidth devices, by utilizing a reflective component to reflect, redirect and focus acoustic or electromagnetic radiation.

BACKGROUND OF THE INVENTION

Heretofore, acoustic and other transducers, including loudspeakers, compression drivers, light sources and sources of electromagnetic radiation such as antennas or klystron devices, have made use of a myriad of methods to convert electric signals from one form to another or, in the case of acoustic transducers to convert electric signals to acoustic signals. For example, the vast majority of acoustic transducers operate by electromagnetically coupling an electric signal to a diaphragm in order to create the acoustic signal. A primary deficiency of these acoustic transducers is their frequency dependent beamwidth. In the case of electromagnetic transducers, a uniform controlled beamwidth and the elimination of interference between multiple transducers is crucial to improved signal reception and reproduction. In general, the beamwidth of many state-of-the-art acoustic and electromagnetic transducers is a function of the frequency of vibration and the size of the vibrating element.

Because of the interdependence of transducer size, frequency, and beamwidth, typical acoustic transducer systems (such as a loudspeaker) utilize a multiple transducer arrangement to produce an acceptable beamwidth throughout the frequency range of human hearing. A primary deficiency in this use of multiple transducers is that the physical size of a transducing element places a constraint on how closely together in spatial alignment multiple transducers can be located with respect to one another. This constraint results in interference between the radiated energy fields of different transducers at frequencies where the transducers overlap, which in the case of an acoustic transducing system causes a degradation in the overall sound quality that is detectable by the human ear. This interference is due to the unequal pathlengths traveled by radiated energy waves that emanate from two different sources but which come together at the same point. Therefore in the case of acoustic transducers, it is crucial to sound quality to locate multiple transducers in as close a spatial alignment as possible. This will minimize the interference between transducers and create an overall sound pattern that mimics the actual sound source as closely as possible.

Recently a transducing system has become available (U.S. Pat. No. 4,421,200) which controls beamwidth dependence by using a reflective component shaped as a section of elliptical cross sections that have radially oriented distinct focal points and share a common focal point. Transducers placed at the distinct focal points have their acoustic or electromagnetic radiation redirected to the common focal point. By selecting the parameters of the ellipses and their orientation with respect to one another, the redirected energy, appearing to emanate from the common focal point, can be made to have a nearly constant beamwidth, irrespective of the frequency dependent beamwidth of the transducers placed at the distinct focal points. The beamwidth of the redirected energy in this novel transducing system is fixed by the parameters of the ellipses shaping the reflective component, and thus is not variable. Moreover, it may not be possible to reflect all the radiation emitted from the transducers, resulting in interference between the reflected and non-reflected radiation.

Another new transducing system (U.S. Pat. No. 4,629,030) utilizes a reflective component with a surface defined by an ellipse that is rotated about an axis of revolution which lies in the plane of the ellipse, and which is oriented at any finite angle with respect to the major axis of the ellipse. This axis of revolution contains the focal points that are common to the ellipse as it is rotated. This reflective component is characterized by a common focal point as well as a focal curve. By placing a transducer at the common focal point, electromagnetic or acoustic radiation is redirected by the reflective component and focused on the focal curve, causing the focal curve to appear as the source of the radiation. Conversely, electromagnetic or acoustic radiation emitted from a transducer placed at the focal curve will be focused on the common focal point. In that case, the common focal point appears to be the source of the radiation. This transducing system also has a fixed beamwidth determined by the parameters of the ellipse shaping the reflective component. It is also possible for the redirected energy to be degraded by interference with electromagnetic or acoustic radiation which emanates from the transducer but does not strike the reflective component.

Yet another new transducing system (U.S. Pat. No. 4,836,328) utilizes a reflective component with a surface defined by a parabola that is rotated about an axis of revolution that lies in the plane of the parabola and is oriented parallel to the major axis of the parabola. The reflective component is characterized by a focal curve. Electromagnetic or acoustic radiation emanating from a transducer placed perpendicular to both axes will be redirected by the reflective component and focused on the focal curve, causing the focal curve to appear as the source of the radiation. Conversely, electromagnetic or acoustic radiation from a transducer placed at the focal curve will be redirected as if emanating from a plane wave. This transducing system is also has a fixed beamwidth determined by the parameters of the parabola shaping the reflective component, and it is possible that the redirected energy may be degraded by interference with electromagnetic or acoustic radiation which emanates from the transducer but does not strike the reflective component.

All of the above transducer systems, including those which produce a substantially invariant beamwidth throughout their frequency range, are limited when used in multiple transducer extended frequency bandwidth devices, since the physical size of the transducing elements does not allow them to be closely spatially aligned, causing interference at those frequencies where the transducers overlap.

The invention described herein provides for a method to improve the above described transducing systems for use in multiple transducer extended frequency bandwidth devices, by providing a means to focus and redirect the output of multiple transducers into a more localized area, thereby minimizing the interference normally created by the use of multiple transducers. The invention utilizes a novel reflective component, which has a surface defined by the coincident surfaces of revolution of an ellipse and a parabola, and which is characterized by two distinct focal curves (which may be coincident) and a single focal point, common to the elliptical surface. Multiple transducers placed in positions as described below will have their radiation appearing to emanate from these focal curves. The virtual sources of the radiation are the focal curves, which are substantially closer in spatial alignment than the transducers themselves, largely eliminating the interference that would be experienced if two separate, constant beamwidth transducers were used without the reflective shell. The overall output of this arrangement minimizes the interference between the multiple transducers at overlapping frequencies, while at the same time maintaining the substantially frequency invariant beamwidths known to be gained by the use of such reflective surfaces.

The invention described herein also provides for a method to improve these transducing systems by providing a means for varying and directing the beamwidth of the redirected acoustic or electromagnetic energy without altering the parameters of the reflective component, and by providing a means to attenuate or eliminate the energy which emanates from a transducer but does not strike the reflective component.

Accordingly, it is an object of this invention to provide a device which will minimize interference from multiple transducers, by utilizing a reflective component to focus acoustic or electromagnetic radiation emitted from the transducers into focal curves that are in closer spatial alignment with one another than the transducers themselves, while at the same time maintaining the substantially frequency invariant beamwidths found in the use of such reflective components.

It is another object of this invention to provide a reflective component which will minimize interference from multiple transducers, including a means of varying and directing the beamwidth of acoustic or electromagnetic radiation emitted from the transducing system without altering the parameters of the reflective component, and including an acoustic or electromagnetic absorbing element which will attenuate or eliminate that radiation emitted from a transducer which would not otherwise strike the reflective component.

SUMMARY OF THE INVENTION

In general, the invention comprises a device capable of emitting either acoustic or electromagnetic radiant energy. The device has at least two transducing elements for producing this energy, and at least one reflector which reflects the energy emitted from the transducing elements. The shape of the reflector surface is defined by both an ellipse and a parabola that are rotated about a common axis of revolution (hereinafter referred to as a "para-elliptic" reflector surface), defined by coincidentally rotating, for up to one complete revolution, a section of both geometric shapes about a common axis of revolution that lies in the plane of both geometric shapes.

In the case of the ellipse, the axis of revolution lies in the plane of the ellipse, is oriented at any angle greater than zero with respect to the major axis of the ellipse, and intersects the major axis of the ellipse at the focal point that is common to the continuum of ellipses defined by the rotation. In the case of the parabola, the axis of revolution lies in the plane of the parabola, and is parallel to the major axis of the parabola. The resulting "para-elliptic" reflector surface will be characterized by two sets of distinct focal points defining two focal curves. One focal curve (the elliptical focal curve) contains the unique focal point of each single ellipse in the continuum defined by rotating the ellipse about the common axis of revolution. The other focal curve (the parabolic focal curve) contains the unique focal point of each single parabola in the continuum formed by rotating the parabola about the common axis of revolution.

An elliptical transducing element may be positioned above the reflector surface to produce energy that will be redirected by the reflector surface into an elliptical focal region containing the elliptical focal curve. Likewise, a parabolic transducing element may be positioned above the reflector surface to produce energy that will be reflected by the reflector surface into a parabolic focal region containing the parabolic focal curve. Focused energy will be redirected as if emanating from each focal region, causing each focal region to appear as a virtual source of the energy. The radiation pattern, or beamwidth, of this energy will be substantially frequency invariant. However, the beamwidth for either transducer can be adjusted by moving that transducer to another location. In addition, a means is provided for absorbing or attenuating that radiation which is not reflected from the reflector surface, in order to eliminate interference between reflected and non-reflected radiation.

BRIEF DESCRIPTION OF THE DRAWINGS

FIG. (1) is a perspective view of the para-elliptic reflective component as defined herein, showing the parabolic and elliptical surfaces of revolution used to generate the curvature of this component.

FIG. (2) is a sectional elevation view one embodiment of the invention, utilizing a para-elliptic reflector, and movable transducing elements.

FIG. (3) is a sectional elevation view of another embodiment of the invention, utilizing a para-elliptic reflector, movable transducing elements and a radiation attenuation means.

FIG. (4) is a polar plot of the radiation intensity around the axis of rotational symmetry of the reflector, illustrating the change in the beamwidth of the transducer system as a transducer is moved from a symmetric position about the axis of revolution in a plane perpendicular to this axis.

Figure 1:
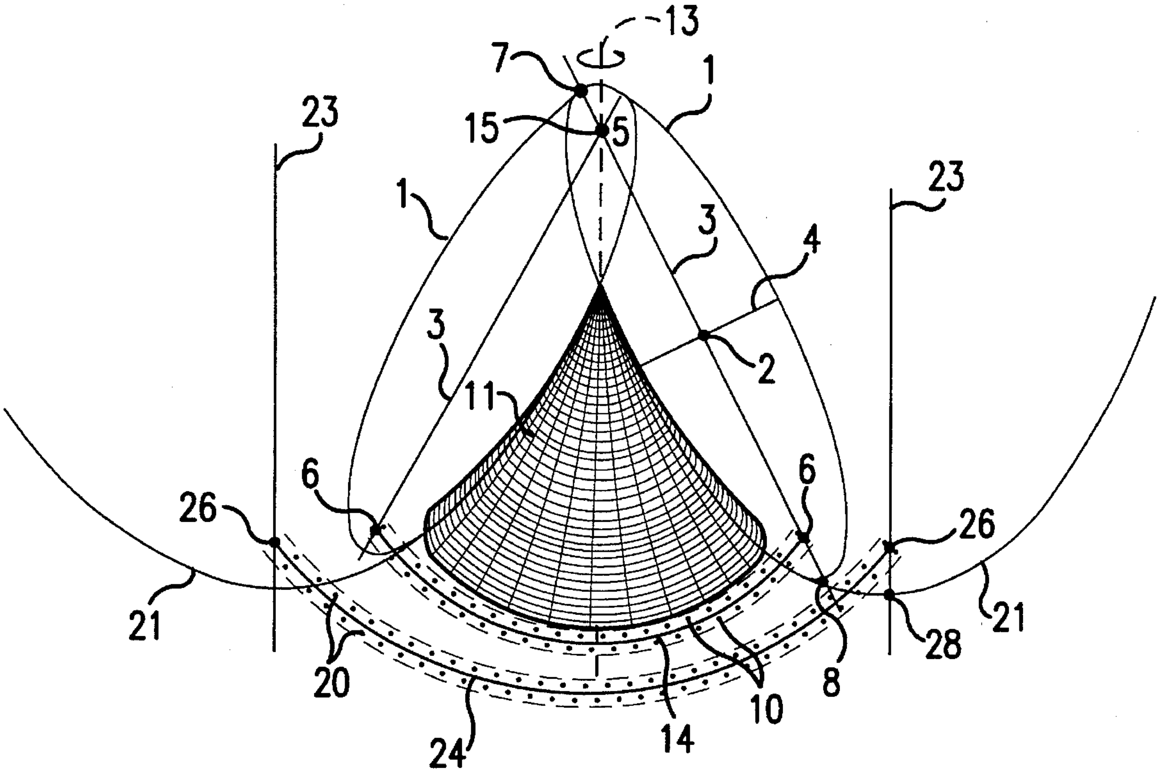
Figure 2:
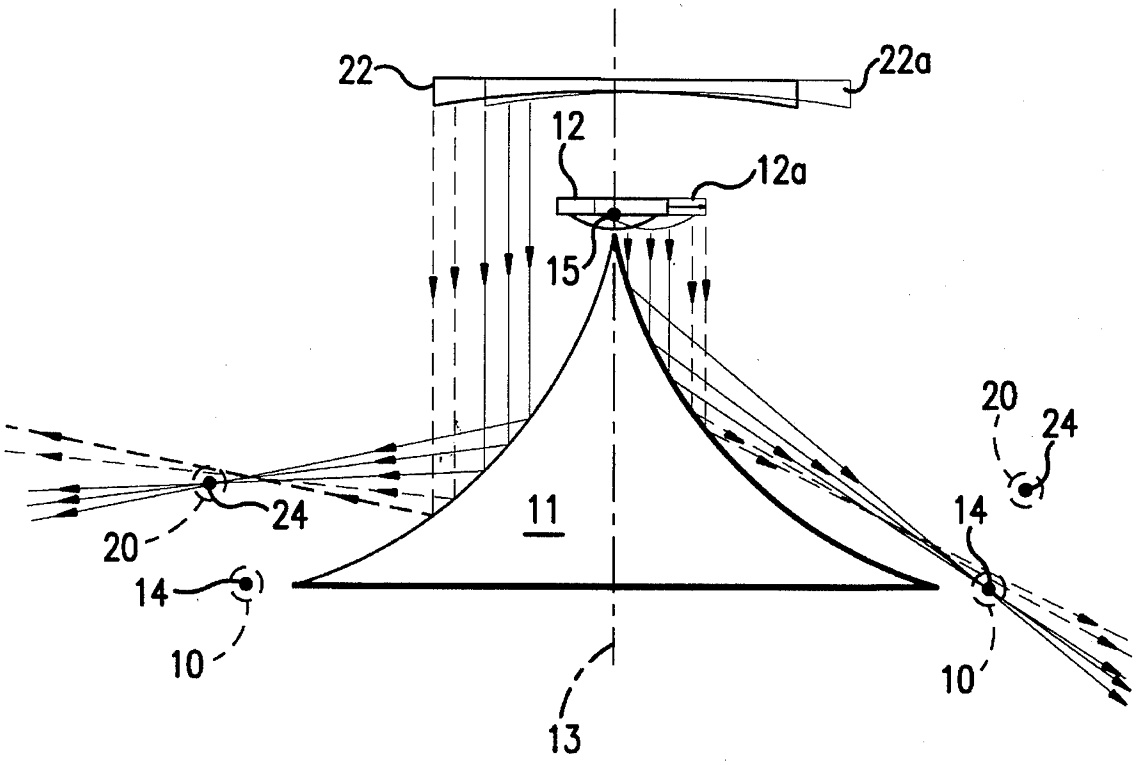
Figure 3:
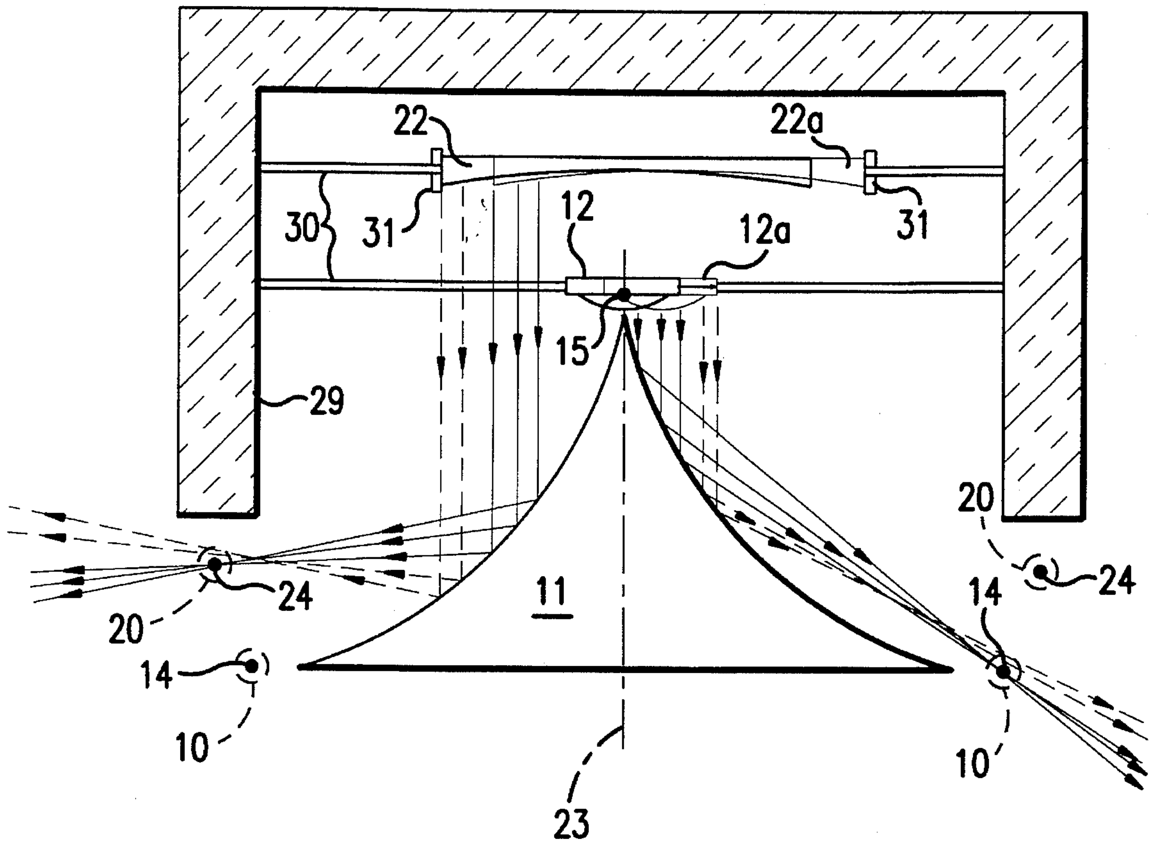
Figure 4:
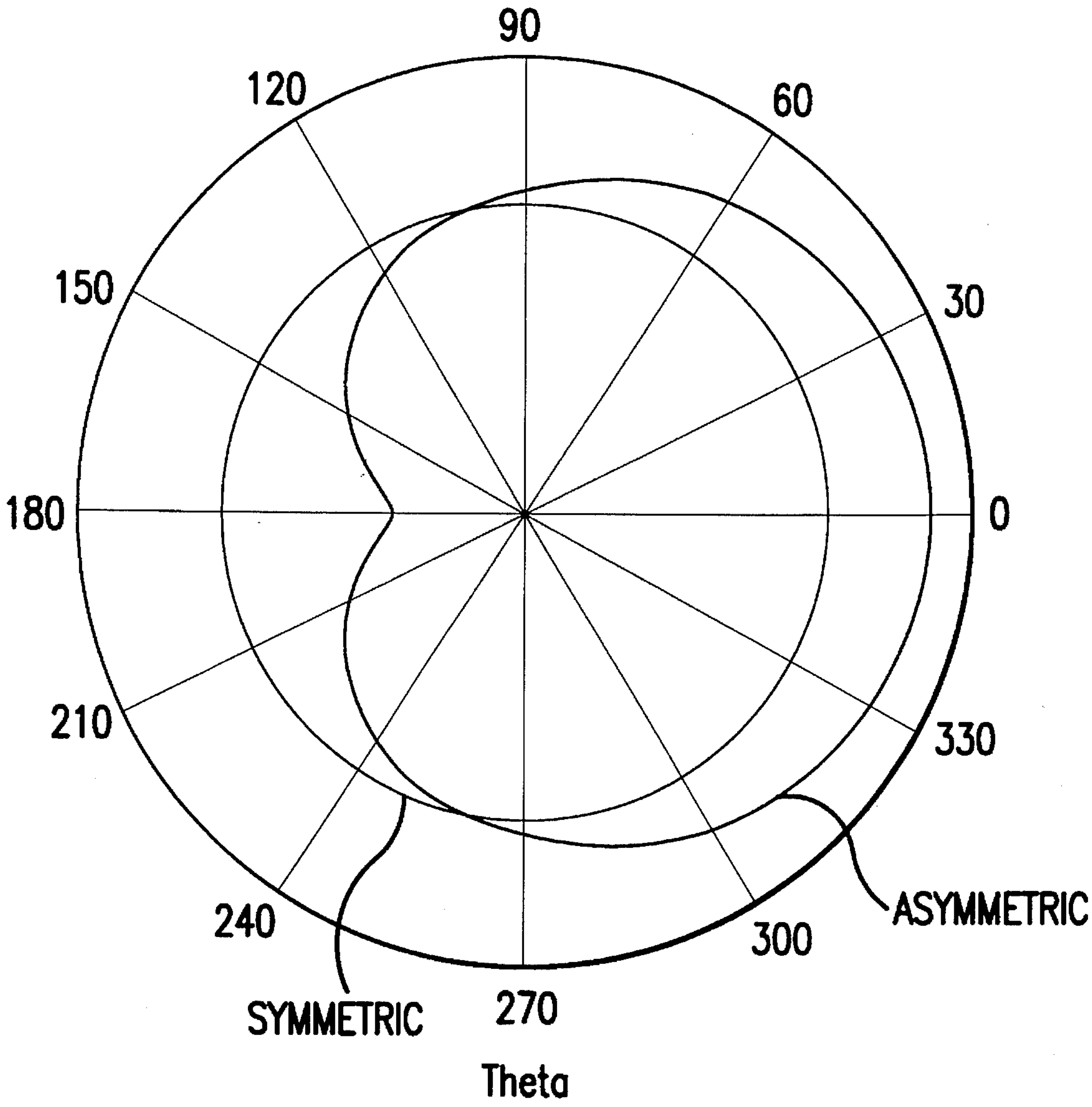
Figure 5:
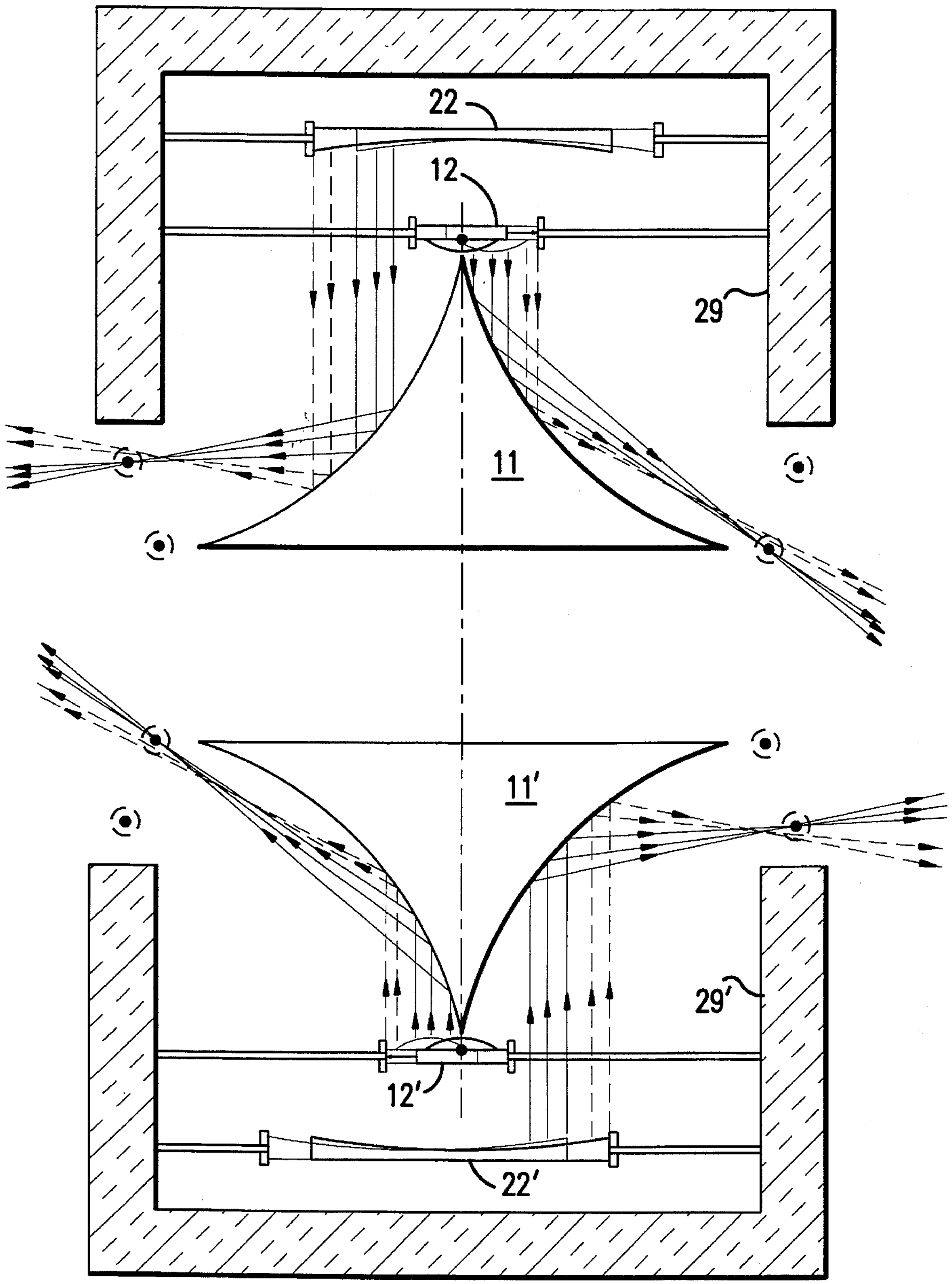

FIG. 5 is a sectional elevation view of one embodiment of the invention, utilizing mirror image dual para-elliptic reflectors, two pairs of movable transducing elements and dual radiation attenuation means.

DETAILED DESCRIPTION OF THE PREFERRED EMBODIMENT

As used herein, the reflector surface is an acoustic or electromagnetic reflective shell, with a surface made of acoustically reflective materials known in the art, such as wood, metal, concrete, or plastic; or with a surface made of materials known to be capable of reflecting electromagnetic energy, such as metal, an electrically conducting metal-fiberglass composite, dielectrics, or mirrors in the case of visible light. The shape of this reflector surface is defined by the coincident surfaces of revolution of an ellipse and a parabola that are rotated about a common axis of revolution. The "para-elliptic" reflector surface described herein is at least a section of an acoustic or electromagnetic reflective shell defined by a "para-elliptic curve" that simultaneously satisfies the description of both the parabolic and elliptical surfaces of revolution given below, and as such is characterized by a common elliptical focal point, and two distinct focal curves (which may be coincident), one elliptical and one parabolic.

Referring to FIG. (1), the ellipse 1 includes two axes 3 and 4 that are perpendicular to one another and that intersect at the center 2 of the ellipse. The major axis 3 is the longer of the two axes, and it contains the two focal points 5 and 6 of the ellipse. The focal points 5 and 6 are located along the major axis 3 at points equidistant from the two vertices 7 and 8, which are both bisected by the major axis 3. The curvature of the surface of the ellipse 1 is such that any wavefront originating at focal point 5 or 6 that is reflected from the elliptical surface will pass through the opposite focal point 6 or 5.

To define the "para-elliptic" reflector surface 11 shown in FIG. (1), the ellipse 1 is rotated about a common axis of revolution 13 that lies in the plane of the ellipse 1. The common axis of revolution 13 can be oriented at any angle greater than zero with respect to the ellipse major axis 3, and it intersects the ellipse major axis 3 at a point 15 that substantially coincides with the focal point 5 that remains common to the continuum of ellipses generated by rotation of the ellipse 1. As a section of the ellipse 1 is rotated about the common axis of revolution 13 for any angular distance between zero and one complete revolution, it defines the elliptical component to the shape of the "para-elliptic" reflector surface 11. This elliptical component of the reflector surface 11 is characterized by a common focal point 15 lying above the reflector surface 11, and a set of distinct focal points defining an elliptical focal curve 14. Each distinct focal point in the elliptical focal curve 14 is the unique focal point 6 of each single ellipse in the continuum of ellipses forming the reflector surface 11.

Coincident with the revolution of the ellipse 1 around the common axis of revolution 13, the "para-elliptic" reflector surface 11 is defined by a parabola 21 rotated about the same common axis of revolution 13. The parabola 21, also shown in FIG. (1), is a curved geometric figure defined by a major axis 23 that bisects a single vertex 28. The parabola 21 is further defined by a single focal point 26, which is located along the parabola major axis 23 such that any wavefront reflected from the surface of the parabola 21 will pass through the focal point 26, and a focal length defined by the distance between the focal point 26 and the vertex 28. To form the "para-elliptic" reflector surface 11 shown in FIG. (1), the parabola 21 is rotated about the common axis of revolution 13, which lies in the plane of the parabola 21, and is oriented substantially parallel to the parabola major axis 23. As a section of the parabola 21 is rotated about the common axis of revolution 13 for any angular distance between zero and one complete revolution, it defines the parabolic component to the shape of the "para-elliptic" reflector surface 11. This parabolic component of the reflector surface 11 is characterized by a set of distinct focal points defining a parabolic focal curve 24. Each distinct focal point in the parabolic focal curve 24 is the unique focal point 26 of each single parabola in the continuum of parabolas forming the reflector surface 11.

Ideally as shown in FIG. (2), energy produced by a transducing element 12 symmetrically positioned about the common axis of revolution 13 will be reflected entirely on the focal curve 14. In the case of the ellipse, the energy will be focused entirely onto the elliptical focal curve 14 if the elliptical transducing element 12 is positioned such that the "virtual source" of its produced energy coincides with the common focal point 15. The "virtual source" is characterized as that point from which all the energy produced by the elliptical transducing element 12 would emanate, if the elliptical transducing element 12 were replaced by a single point. As shown in FIG. (2), an elliptical transducing element 12, not symmetrically positioned about the common axis of revolution 13, will produce energy that is substantially focused into an elliptical focal region 10 containing the elliptical focal curve 14. The focused energy will be redirected as if emanating from the elliptical focal region 10, causing the elliptical focal region 10 to appear as the source of the energy.

It is well known in the state of the art that transducing systems utilizing a reflective component will function properly despite a lack of perfect precision in the positioning of the transducing element relative to the reflective surface. This lack of precision may be created by machining tolerances in the reflective surface, or by an inexact mounting of the transducing element relative to the reflective component. When a lack of perfect precision prevents the elliptical transducing element **12*a* from being positioned in an exactly symmetric manner about the reflector common axis of revolution 13, its energy will not be focused entirely on the elliptical focal curve 14, but will be substantially focused into an elliptical focal region 10 surrounding the elliptical focal curve 14. The principal limitation placed on the positioning of the elliptical transducing element 12 with respect to the reflector common axis of revolution 13 is that the energy produced by the elliptical transducing element 12 that strikes the reflector surface 11 must be substantially focused into the elliptical focal region 10. In the elliptical embodiment, the redirected energy will be substantially focused into the elliptical focal region 10 if the elliptical transducing element 12*a* is positioned such that the "virtual source" of the produced energy is approximately, but not perfectly, coincident with the common focal point 15**.

Similarly as shown in FIG. (2), radiant energy produced by a parabolic transducing element 22 positioned symmetrically about the common axis of revolution 13, that travels a path substantially parallel to the common axis of revolution 13, will be reflected by the reflector surface 11 entirely on the parabolic focal curve 24. Radiant energy produced by a transducing element **22*a* positioned anywhere above the reflector surface 11, that travels a path substantially parallel to the common axis of revolution 13, will be substantially focused by the reflector surface 11 into a parabolic focal region 20 surrounding the parabolic focal curve 24. The focused energy will be redirected as if emanating from the parabolic focal region 20, causing the parabolic focal region 20** to appear as the source of the energy.

The focal regions 10 or 20 are areas having an increased concentration of acoustic or electromagnetic radiant energy. The level of energy concentration within the focal regions 10 or 20 will vary relative to the positioning of the transducing element 12 or 22 with respect to the reflector common axis of revolution 13. In one embodiment, this invention takes advantage of these characteristic focal regions by varying the positioning of the transducing element relative to the reflector axis of revolution to control and vary the beamwidth shape of the redirected energy that is reflected through the focal regions.

The transducer described herein may act as an acoustic transducer, which acts to convert an electrical signal to an acoustical signal by any methods known in the state of the art such as a loudspeaker, or as an electromagnetic transducer, which acts to convert an electric signal to an electromagnetic signal by any methods known in the state of the art such as an antenna or light source. Other transducing means in the state of the art that will convert electrical current into acoustic energy (such as plasma or glow discharge loudspeaker), or that will convert electrical current into electromagnetic radiation (such as a laser, light-emitting diode, glow discharge tube or a lightbulb) will work with the concepts disclosed and are thus covered the use of the term transducer herein.

The embodiment of the invention showing a means of moving and fixing a transducer at various positions relative to the common axis of revolution 13 is shown in FIG. (2). In the operation of this embodiment of the transducer system, the transducing element 12 or 22 is initially ideally positioned symmetrically about the common axis of revolution 13. Acoustic or electromagnetic radiation emitted from the transducing element 12 or 22 is directed substantially toward the reflector surface 11, is reflected therefrom, and is focused on the appropriate focal curve 14 or 24. The transducing element 12*a* or 22*a* may be moved to another location asymmetric with the common axis of revolution 13. This movement can be accomplished by any means 30 in the state of the art, including mechanically actuated means such as screws or sliding pins, or electrically actuated means such as a servomotor or a piezoelectric motor. The transducing element 12*a* or 22*a* may be fixed at the new location by any means 31 in the state of the art, including mechanically actuated means such as screw locks, or frictional clamps, or electrically actuated means such as a servomotor or a solenoid. In its initial position symmetric about the common axis of revolution 13, radiation emitted frown the transducing element 12 or 22 is initially redirected uniformly from the "para-elliptic" reflector surface 11, with approximately equal intensity and an approximately 360 degree radiation pattern (beamwidth) from any point on the focal curve 14 or 24. As the transducing element 12*a* or 22*a* is moved to a position asymmetric with respect to the common axis of revolution 13, the emitted acoustic or electromagnetic radiation will be redirected non-uniformly from the "para-elliptic" reflector surface 11, with variable intensity and beamwidth from the points within the appropriate focal region 10 or 20 surrounding and containing its focal curve 14 or 24. The means of moving and fixing transducing elements described above can be used with all surfaces and with all transducing elements described. It will also be understood by one of ordinary skill in the art that the means for moving 30 and the means for fixing 31 may be coupled to either the reflector 11 or a transducing element 12 or 22 to accomplish the change in relative positioning described above.

FIG. (4) illustrates the change in intensity of the emitted acoustic or electromagnetic radiation, as an acoustic transducing element is moved as described above. As can be seen, the intensity varies such that the beamwidth of the acoustic signal is narrowed as the transducing element is moved as described above. It is important to note that the beamwidth is controlled by the relative position of the transducing element in relation to the common axis of revolution of the "para-elliptic" reflector surface. The beamwidth of the radiation has been rendered substantially independent of frequency changes by the attributes of the reflector surface as shown in the state of the art, and thus for any fixed location of the transducing element above the reflector surface, the beamwidth will remain constant as the frequency of the radiation is varied. Further the virtual sources of the radiation are the elliptical focal region and the parabolic focal region, sources which are substantially closer in spatial relationship than transducers, largely eliminating the interference that would be experienced if two separate, constant beamwidth transducers were used without the reflective shell.

The embodiment of a means of moving and fixing the transducer at various positions relative to the common axis of revolution 13, combined with a means of attenuating or eliminating that radiation which would not strike the reflective component, is shown in FIG. (3). In the operation of this embodiment, the transducing element 12 or 22 is initially ideally positioned symmetrically about the common axis of revolution 13. Acoustic or electromagnetic radiation emitted from the transducing element 12 or 22 is directed substantially toward the "para-elliptic" reflector surface 11, is reflected therefrom, and is focused on the appropriate focal curve 14 or 24. Acoustic or electromagnetic radiation which would not strike and be reflected from reflector surface 11*a* is absorbed by absorbing element 29. Depending on the nature of the transducing system utilized, the absorbing element 29 may be constructed of a material capable of absorbing or attenuating acoustic energy, such as fiberglass or foam, or of a material capable of absorbing or attenuating electromagnetic radiation, such as carbon-plastic or metallic-plastic composites, or flat black paint in the case of visible light. As is obvious but not shown, the absorbing element 29 may be extended in a direction parallel to the common axis of revolution 13, toward or away from reflector surface 11, so as to vary the amount acoustic or electromagnetic radiation absorbed or attenuated. Finally, as shown in FIG. 5, another embodiment of the present invention utilizes mirror image dual para-elliptic reflectors 11 and 11', two pairs of transducing elements 12 and 12', 22 and 22', respectively, and dual radiation attentuation means 29 and 29', resulting in a transducing system which will omnidirectionally radiate acoustic or electromagnetic energy in a horizontal plane to double the vertical dispersion range when compared to the use of a single reflector.

While presently preferred embodiments have been shown and described in particularity, the invention may be otherwise embodied within the scope of the appended claims.

What is claimed is:

1. An apparatus for transducing radiant or acoustical energy, which comprises:

A. at least one reflector for reflecting said energy, having a surface defined by:
   - (i) rotating about a first axis at least a section of an ellipse having a major axis and a minor axis and two focal points, said first axis lying in a plane of said ellipse and passing through a first focal point of said ellipse, said first focal point being substantially coincident with a point defined by the intersection of said first axis and said major axis, said first axis being at an angle greater than zero to said major axis, said reflector reflecting said energy into a first focal region having an energy intensity about a first focal arc defined by the rotation of a second focal point of said ellipse about said first axis; and
   - (ii) rotating about said first axis at least a section of a parabola having a major axis and a focal length defined by a focal point, said first axis lying in a plane of said parabola and being substantially parallel to said major axis, said reflector reflecting said energy into a second focal region having an energy intensity about a second focal arc defined by the rotation of the focal point of said parabola about said first axis; and B. at least two transducing elements for producing said energy, comprising:
   - (i) at least one first transducing element positioned above said reflector surface to substantially focus said energy into said first focal region; and
   - (ii) at least one second transducing element positioned above said reflector surface to substantially focus said energy into said second focal region.

2. The apparatus of claim 1, further comprising, at least one means being coupled to at least one said transducing element or said reflector to alter the relative position of said transducing element and said reflector such that said energy is substantially focused into at least one said focal region and such that said reflected energy will vary in intensity and beamwidth.

3. The apparatus of claim 2, further comprising, at least one means being coupled to at least one said transducing element or said reflector to fix the relative position of said transducing element and said reflector such that said energy is substantially focused into at least one said focal region.

4. The apparatus of claim 1, further comprising an element capable of absorbing said energy which encompasses at least a portion of at least one said transducing element or said reflector to absorb said energy which is not incident upon said reflector.

5. The apparatus of claim 4, wherein said absorbing element is movable such that the amount of said energy absorbed varies with the position of said absorbing element.

6. The apparatus of claim 1, wherein said transducing elements are positioned symmetrically with respect to said reflector.

7. The apparatus of claim 1, wherein said transducing elements are positioned asymmetrically with respect to said reflector.

8. The apparatus of claim 1, further comprising two reflectors which are positioned as mirror images of each other.

9. The apparatus of claim 8, further comprising two pairs of transducing elements which are positioned as mirror images of each other.

10. The apparatus of claim 1, further comprising one reflector.

11. The apparatus of claim 10, further comprising two transducing elements.

12. The apparatus of claim 1, wherein acoustic sound waves are transduced.

13. The apparatus of claim 1, wherein electromagnetic radiation is transduced.

14. The apparatus of claim 13, wherein microwave radiation is transduced.

15. The apparatus of claim 1, wherein at least one of the group consisting of:

A. said angle;

B. the length of said major axis of said ellipse;

C. the length of said minor axis of said ellipse; and

D. said focal length of said parabola is varied over the surface of said reflector.

* * * * *